US012698939B2

(12) United States Patent
Lim

(10) Patent No.: US 12,698,939 B2
(45) Date of Patent: Aug. 4, 2026

(54) HIGH PRESSURE HEAT TREATMENT APPARATUS

(71) Applicant: HPSP Co., Ltd., Gyeonggi-do (KR)

(72) Inventor: Kun Young Lim, Gyeonggi-do (KR)

(73) Assignee: HPSP Co., Ltd., Gyeonggi-do (KR)

( * ) Notice: Subject to any disclaimer, the term of this patent is extended or adjusted under 35 U.S.C. 154(b) by 648 days.

(21) Appl. No.: 18/145,331

(22) Filed: Dec. 22, 2022

(65) Prior Publication Data

US 2023/0204290 A1 Jun. 29, 2023

(30) Foreign Application Priority Data

Dec. 23, 2021 (KR) ........................ 10-2021-0185713

(51) Int. Cl.
*F27D 7/02* (2006.01)
*F27B 17/00* (2006.01)
(Continued)

(52) U.S. Cl.
CPC ................. *F27D 7/02* (2013.01); *F27D 7/06* (2013.01); *F27D 99/007* (2013.01);
(Continued)

(58) Field of Classification Search
CPC . F27D 7/02; F27D 7/06; F27D 99/007; F27D 2001/0059; F27D 2007/063;
(Continued)

(56) References Cited

U.S. PATENT DOCUMENTS

| | | | |
|---|---|---|---|
| 5,271,732 A | 12/1993 | Yokokawa | |
| 2005/0093460 A1 | 5/2005 | Kim et al. | |

(Continued)

FOREIGN PATENT DOCUMENTS

| | | |
|---|---|---|
| CN | 208433378 U | 1/2019 |
| JP | H07-193020 A | 7/1995 |

(Continued)

OTHER PUBLICATIONS

JP-2010016285-A translation (Year: 2025).*

(Continued)

*Primary Examiner* — Michael G Hoang
*Assistant Examiner* — Kurt J Wolford
(74) *Attorney, Agent, or Firm* — Secant, IP PLLC; Jay S. Franklin

(57) ABSTRACT

Provided is a high pressure heat treatment apparatus including: an internal chamber accommodating an object to be heat-treated; an external chamber including a housing and a partition plate partitioning the housing into a high-temperature zone accommodating the internal chamber and a low-temperature zone having a lower temperature than the high-temperature zone, the partition plate including a discharge hole for allowing the high-temperature zone and the low-temperature zone to communicate with each other; a gas supply module configured to supply a process gas for the heat treatment to the internal chamber at a first pressure higher than that of the atmosphere, and supply a protective gas to the high-temperature zone and the low-temperature zone at a second pressure set in relation to the first pressure; and a discharge module configured to open the discharge hole to discharge the protective gas in the high-temperature zone to the low-temperature zone.

9 Claims, 6 Drawing Sheets

(51) Int. Cl.

| | | |
|---|---|---|
| *F27D 1/00* | (2006.01) | |
| *F27D 7/06* | (2006.01) | |
| *F27D 9/00* | (2006.01) | |
| *F27D 99/00* | (2010.01) | |
| *H01L 21/67* | (2006.01) | |
| *H10P 72/00* | (2026.01) | |

(52) U.S. Cl.

CPC ...... *H10P 72/0431* (2026.01); *H10P 72/0434* (2026.01); *H10P 72/0436* (2026.01); *H10P 72/0602* (2026.01); *F27B 17/0025* (2013.01); *F27D 2001/0059* (2013.01); *F27D 2007/063* (2013.01); *F27D 2009/0005* (2013.01); *F27D 2009/001* (2013.01); *F27D 2009/0013* (2013.01); *H10P 72/0462* (2026.01)

(58) Field of Classification Search

CPC ....... F27D 2009/0005; F27D 2009/001; F27D 2009/0013; H01L 21/67098; H01L 21/67109; H01L 21/67115; H01L 21/67248; H01L 21/6719; F27B 17/0025

See application file for complete search history.

(56) References Cited

U.S. PATENT DOCUMENTS

| | | | |
|---|---|---|---|
| 2007/0231246 A1 | 10/2007 | Hwang et al. | |
| 2011/0165283 A1 | 7/2011 | Nakai et al. | |
| 2013/0042803 A1* | 2/2013 | Saido ............... | H01L 21/67109 |
| | | | 117/88 |
| 2014/0174364 A1 | 6/2014 | Nakao et al. | |
| 2019/0086808 A1 | 3/2019 | Nakayama et al. | |
| 2019/0148178 A1 | 5/2019 | Liang et al. | |
| 2020/0122235 A1* | 4/2020 | Burstrom .................. | B22F 3/15 |
| 2020/0385867 A1 | 12/2020 | Kim et al. | |

FOREIGN PATENT DOCUMENTS

| | | | | | |
|---|---|---|---|---|---|
| JP | 2005-167148 | A | | 6/2005 | |
| JP | 2006-203033 | A | | 8/2006 | |
| JP | 2009-129925 | A | | 6/2009 | |
| JP | 2009-539231 | A | | 11/2009 | |
| JP | 2010016285 | A | * | 1/2010 | |
| JP | 2019-057641 | A | | 4/2019 | |
| JP | 2020-123602 | A | | 8/2020 | |
| JP | 2020-526925 | A2 | | 8/2020 | |
| KR | 2005-0042701 | A | | 5/2005 | |
| KR | 20140127955 | A | * | 11/2014 | .......... C23C 16/463 |
| KR | 10-2015-0086834 | A | | 7/2015 | |
| KR | 20200109672 | A | | 9/2020 | |
| KR | 10-2021-0041340 | A | | 4/2021 | |
| KR | 2021-0086587 | A | | 7/2021 | |
| KR | 10-2325324 | B1 | | 11/2021 | |

OTHER PUBLICATIONS

KR-20140127955-A translation (Year: 2025).*

Japanese Office Action Corresponding to 2022-204717 drafted Jan. 12, 2024.

European Office Action Corresponding to 22214435.4 mailed Nov. 16, 2023.

Korean Office Action Corresponding to 10-2021-0188405 mailed Mar. 22, 2022.

Korean Office Action Corresponding to 10-2021-0185713 mailed Mar. 22, 2022.

Chinese Office Action Corresponding to 202211664111.3 mailed Aug. 1, 2025.

Korean Office Action Corresponding to 10-2021-0182552 mailed Mar. 23, 2022.

Search Report & Written Opinion issued in Singapore application 10202260513V dated Oct. 6, 2025.

* cited by examiner

FIG. 5
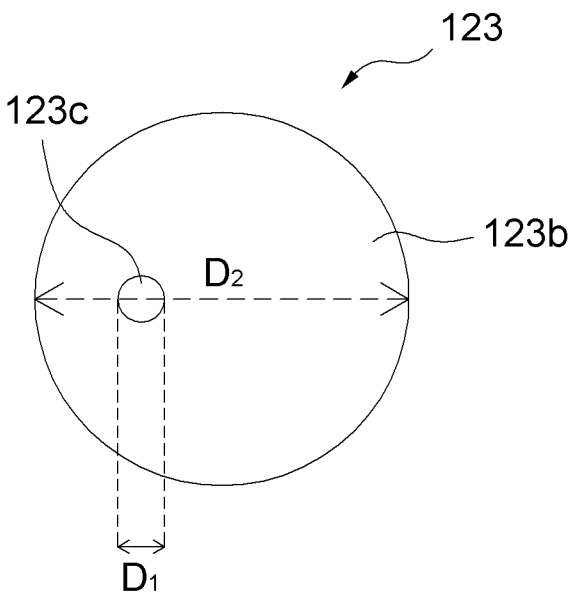
[FIG. 6]
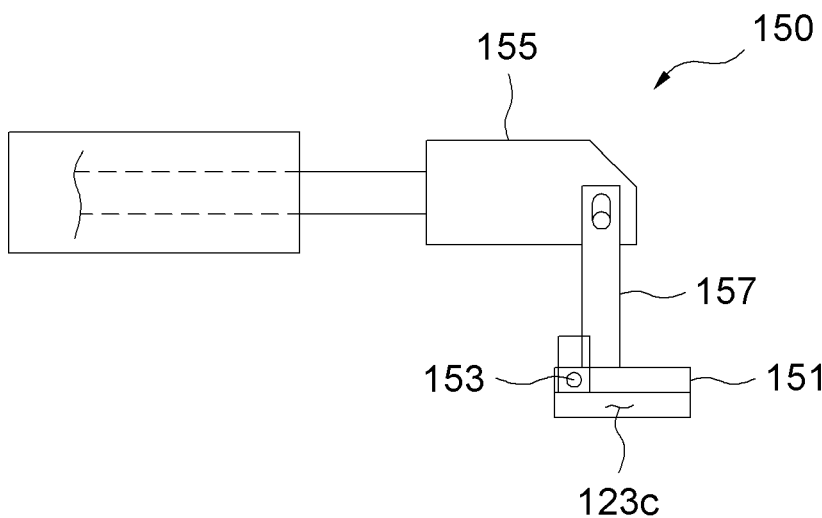

HIGH PRESSURE HEAT TREATMENT APPARATUS

BACKGROUND

Field

The present disclosure relates to a heat treatment apparatus used to heat-treat an object in a high-pressure environment.

Description of the Related Art

In general, an ion implantation process during semiconductor fabrication may cause damage to an interface of a wafer. Annealing may be a process of healing the damage to the corresponding wafer through heat treatment. In addition to the annealing, the heat treatment may also be performed on the wafer when activating impurities, when performing a chemical vapor deposition (CVD) process to form a thin film, and when performing an ohmic contact alloy process.

During the heat treatment, a gas may act on the wafer. The gas may be supplied at a high pressure to a chamber in which the wafer is accommodated. After the heat treatment is finished, the used gas may be exhausted from the chamber. After the gas is exhausted, the heat-treated wafer may be withdrawn from the chamber. A new wafer and the gas may then be provided to the chamber for the next heat treatment.

The chamber may have a sealing ability of a predetermined level or higher to prevent the gas from leaking to the outside. The sealing ability (and insulation property) of the chamber may also be important to prevent heat in the chamber from leaking to the outside. However, this sealing ability may act as an obstacle to lowering a temperature of the chamber.

In detail, the heat treatment may be performed at a high temperature, and it is thus necessary to lower the temperature of the chamber during or after the heat treatment. For example, the temperature of the chamber is first required to be lower to withdraw the heat-treated wafer after the heat treatment is finished. However, a long time needs to cool the chamber due to the sealing ability of the chamber. As a result, a tact time in a heat treatment process for the wafers may become longer.

SUMMARY

An object of the present disclosure is to provide a high pressure heat treatment apparatus in which a high-temperature chamber can be rapidly cooled when necessary.

According to an embodiment of the present disclosure, a high pressure heat treatment apparatus includes: an internal chamber accommodating an object to be heat-treated; an external chamber including a housing and a partition plate partitioning the housing into a high-temperature zone accommodating the internal chamber and a low-temperature zone having a lower temperature than the high-temperature zone, the partition plate including a discharge hole for allowing the high-temperature zone and the low-temperature zone to communicate with each other; a gas supply module configured to supply a process gas for the heat treatment to the internal chamber at a first pressure higher than that of the atmosphere, and supply a protective gas to the external chamber at a second pressure set in relation to the first pressure; and a discharge module configured to open the discharge hole to discharge the protective gas in the high-temperature zone to the low-temperature zone.

The housing may include a cover part defining the low-temperature zone together with the partition plate, and at least one of the cover part and the partition plate may accommodate a cooling medium for cooling the protective gas discharged to the low-temperature zone.

The cover part may be disposed above the partition plate while facing the partition plate, and both the cover part and the partition plate may accommodate the cooling medium for the low-temperature zone to be filled with cold air discharged from the cooling medium.

The cover part may accommodate a greater amount of cooling medium than the partition plate.

The external chamber may enable the protective gas to circulate to the high-temperature zone after being cooled in the low-temperature zone by exchanging heat with a cooling medium.

The discharge module may include a hole cover positioned to correspond to the discharge hole, and a driving unit configured to move the hole cover between a closing position for closing the discharge hole and an opening position for opening the discharge hole.

The discharge module may further include a hinge for rotatably coupling the hole cover to the partition plate.

The driving unit may include an actuator configured to move forward and backward, and a link coupled to the hole cover and rotatably coupled to the actuator.

The apparatus may further include a gas exhaust module configured to exhaust the process gas and the protective gas from the internal chamber and the external chamber, wherein the discharge module is operated to open the discharge hole before the gas exhaust module is operated.

The apparatus may further include a heating module disposed in the high-temperature zone, and configured to heat the process gas and the protective gas in the high-temperature zone, wherein the partition plate further includes a heat insulation layer disposed to face the heating module.

According to another embodiment of the present disclosure, a high pressure heat treatment apparatus includes: an internal chamber accommodating an object to be heat-treated; an external chamber including a housing, the housing being partitioned into a high-temperature zone accommodating the internal chamber and a low-temperature zone having a lower temperature than the high-temperature zone; a gas supply module configured to supply a process gas for the heat treatment to the internal chamber at a first pressure higher than that of the atmosphere, and supply a protective gas to the external chamber at a second pressure set in relation to the first pressure; a heating module disposed in the high-temperature zone, and configured to heat the process gas and the protective gas in the high-temperature zone; and a discharge module configured to discharge the protective gas heated in the high-temperature zone by the heating module to the low-temperature zone.

The housing may include a partition plate partitioning the high-temperature zone and the low-temperature zone from each other, and a cover part defining the low-temperature zone together with the partition plate, wherein the partition plate includes a passage for discharging the protective gas to the low-temperature zone.

The passage may include a discharge hole passing through the partition plate and allowing the high-temperature zone and the low-temperature zone to communicate with each other, and the discharge module may include a hole cover positioned to correspond to the discharge hole, and a driving unit configured to move the hole cover between a closing position for closing the discharge hole and an opening position for opening the discharge hole.

The apparatus may further include a gas exhaust module configured to exhaust the process gas and the protective gas from the internal chamber and the external chamber, wherein the discharge module is operated to discharge the protective gas from the high-temperature zone to the low-temperature zone before the gas exhaust module is operated.

The partition plate may further include a heat insulation layer disposed above the heating module to face the heating module.

BRIEF DESCRIPTION OF THE DRAWINGS

FIG. 5 is a plan view of a partition plate 123 of FIG. 4.

FIG. 6 is a conceptual diagram showing one state of the discharge module 150 of FIG. 3.

DETAILED DESCRIPTION

Figure 1:
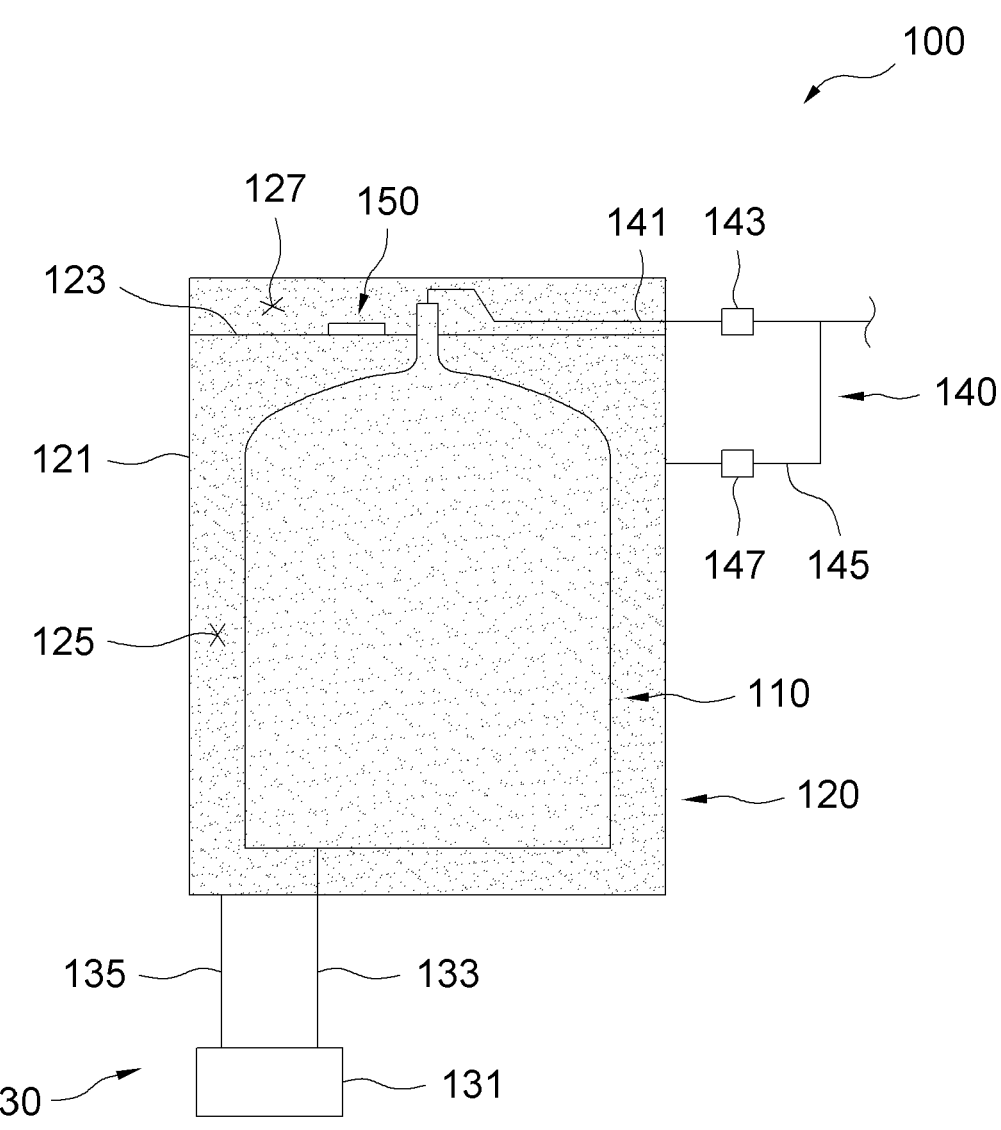
FIG. 1 is a conceptual diagram of a high pressure heat treatment apparatus 100 according to an embodiment of the present disclosure.

Hereinafter, a high pressure heat treatment apparatus according to embodiments of the present disclosure are described in detail with reference to the accompanying drawings. Throughout the present disclosure, components that are the same as or similar to each other are denoted by reference numerals that are the same as or similar to each other, and a description thereof is replaced by the first description, even in a different embodiment.

FIG. 1 is a conceptual diagram of a high pressure heat treatment apparatus 100 according to an embodiment of the present disclosure.

Referring to this drawing, the high pressure heat treatment apparatus 100 may include an internal chamber 110, an external chamber 120, a gas supply module 130, a gas exhaust module 140, and a discharge module 150.

The internal chamber 110 may have an accommodation space accommodating an object to be heat-treated. The internal chamber 110 may be made of a non-metallic material, for example, quartz, to reduce a possibility that contaminants (particles) are present in a high-pressure and high-temperature process environment. Although simplified in the drawing, a door (not shown) for opening the accommodation space may be positioned at a lower end of the internal chamber 110. The accommodation space may be opened as the door descends, and the object may be put into the internal chamber IC while being mounted on a holder (not shown). As a heater (not shown) disposed outside the internal chamber 110 is operated, the internal chamber 110 may be heated up to several hundred degrees Celsius. The object may be, for example, a semiconductor wafer. In this case, the holder may be a wafer boat which may stack the semiconductor wafers in a plurality of layers.

The external chamber 120 may be configured to accommodate the internal chamber 110. Unlike the internal chamber 110, the external chamber 120 is free from a problem of contamination of the semiconductor wafer, and may thus be made of a metal material. The external chamber 120 may include a housing 121 having an inner space accommodating the internal chamber 110. The housing 121 may also have a door (not shown) at a lower portion, and the door may open the inner space while descending together with the door of the internal chamber 110.

The inner space may be partitioned into two zones by the partition plate 123. A zone positioned lower than the partition plate 123 may be a high-temperature zone 125 where the internal chamber 110 is positioned. The other zone positioned higher than the partition plate 123 may be a low-temperature zone 127 having a lower temperature than the high-temperature zone 125. The high-temperature zone 125 may have a temperature close to that of the internal chamber 110 due to heating of the heater, and the low-temperature zone 127 may have a much lower temperature than the high-temperature zone 125. The low-temperature zone 127 may be affected by a cooling medium, for example, cooling water.

The gas supply module 130 may be configured to supply a gas to the chambers 110 and 120. The gas supply module 130 may have a gas supplier 131 communicating with a utility (or a gas supply facility) of a semiconductor factory. The gas supplier 131 may selectively supply the internal chamber 110 with a process gas such as hydrogen/deuterium, fluorine, ammonia, chlorine, nitrogen. The gas supplier 131 may provide the external chamber 120 with a protective gas such as nitrogen which is an inert gas. The process gas and the protective gas may each be injected into the internal chamber 110 or the external chamber 120 through a process gas line 133 or a protective gas line 135. The protective gas injected into the external chamber 120 may specifically fill a space between the external chamber 120 and the internal chamber 110.

The process gas and the protective gas may be at pressures higher than that of the atmosphere, and supplied to form, for example, high pressures ranging from several to several tens of atmospheres. In addition, when a first pressure indicates the pressure of the process gas and a second pressure indicates the pressure of the protective gas, these pressures may maintain a predetermined relationship. For example, the second pressure may be set to be slightly higher than the first pressure. Such a pressure difference may prevent the process gas from leaking from the internal chamber 110.

The gas exhaust module 140 may be configured to exhaust the process gas and the protective gas from the chambers 110 and 120. A gas exhaust pipe 141 may be connected to the top of the internal chamber 110 to exhaust the process gas from the internal chamber 110. The exhaust pipe 141 may be disposed in the low-temperature zone 127, and extend out of the external chamber 120 from the low-temperature zone 127. A gas discharger 143 may be installed in the gas exhaust pipe 141. The gas discharger 143 may be a valve that controls the exhaust of the process gas.

Similarly, a gas exhaust pipe 145 communicating with the external chamber 120 and a gas discharger 147 installed therein may be provided to discharge the protective gas from the external chamber 120. These gas exhaust pipes 141 and 145 may communicate with each other, and the process gas may thus be diluted with the protective gas and then exhausted while having a lower concentration.

The discharge module 150 may be configured to discharge the protective gas existing in the high-temperature zone 125 to the low-temperature zone 127. The protective gas existing in the high-temperature zone 125 may have greater thermal energy than the protective gas existing in the low-temperature zone 127, and thus be discharged to the low-temperature zone 127 by convection. The protective gas may lose the thermal energy in the low-temperature zone 127 and circulate to the high-temperature zone 125. The high-temperature zone 125 and the internal chamber 110 may be rapidly cooled by the circulation and heat exchange of the protective gas.

Figure 2:
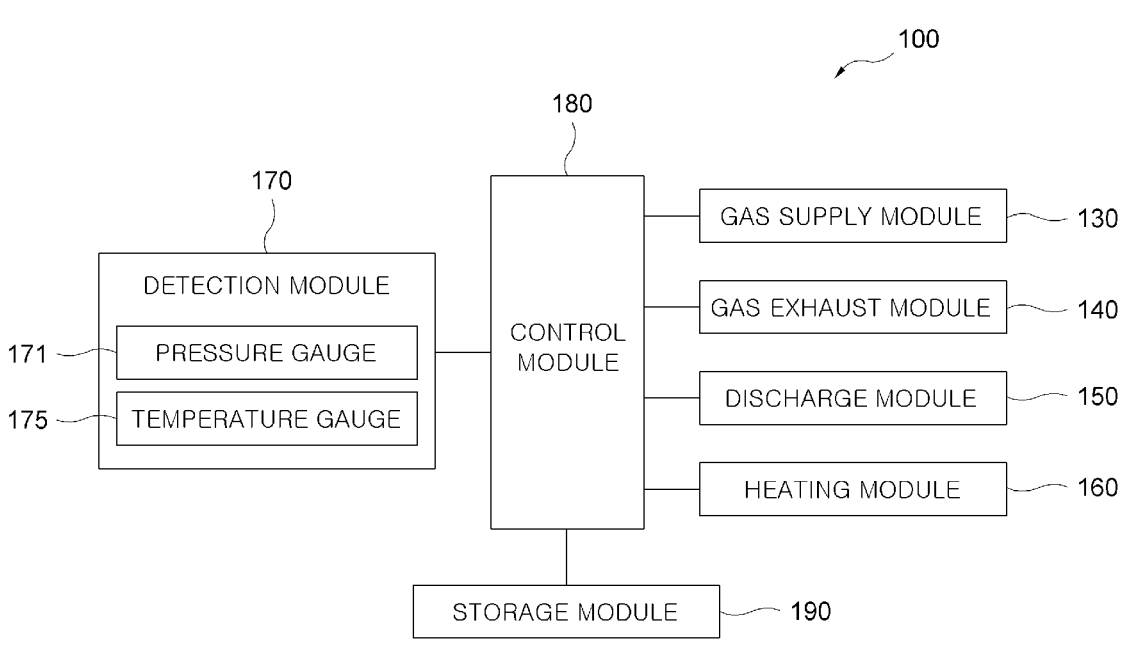
FIG. 2 is a block diagram for explaining a control configuration of the high pressure heat treatment apparatus 100 of FIG. 1.

The description describes a control configuration of the high pressure heat treatment apparatus 100 with reference to FIG. 2. FIG. 2 is a block diagram for explaining the control configuration of the high pressure heat treatment apparatus 100 of FIG. 1.

Referring to this drawing (and FIG. 1), the high pressure heat treatment apparatus 100 may further include a heating module 160, a detection module 170, a control module 180, and a storage module 190 in addition to the gas supply module 130 or the like, described above.

The heating module 160 may be configured to include the above-mentioned heater. The heater may be disposed in the inner space of the external chamber 120. The heater may heat the process gas to a process temperature.

The detection module 170 may be configured to detect environments of the chambers 110 and 120. The detection module 170 may include a pressure gauge 171 and a temperature gauge 175. The pressure gauge 171 and the temperature gauge 175 may be installed in each of the chambers 110 and 120.

The control module 180 may be configured to control the gas supply module 130, the gas exhaust module 140, or the like. The control module 180 may control the gas supply module 130 or the like based on a detection result of the detection module 170.

The storage module 190 may be configured to store data, programs, or the like that the control module 180 may refer to for the control. The storage module 190 may include at least one type of storage medium among a flash memory, a hard disk, a magnetic disk, and an optical disk.

Through this configuration, the control module 180 may control an operation of the gas supply module 130 based on the pressures (i.e., first pressure and second pressure) of the chambers 110 and 120 that are obtained through the pressure gauge 171.

The control module 180 may also control an operation of the discharge module 150 based on the temperatures of the chambers 110 and 120 that are obtained through the temperature gauge 175. The operation of the discharge module 150 may be performed when the temperatures of the chambers 110 and 120 need to be lower during the heat treatment or when the heat treatment is finished.

When the heat treatment is finished, the discharge module 150 may be operated before the gas exhaust module 140 is operated to exhaust the process gas. As the discharge module 150 is operated, the protective gas may cool the process gas by natural circulation and the heat exchange. The process gas may be exhausted by the gas exhaust module 140 while being cooled to a set temperature or less. This configuration may make it possible to preemptively remove a risk factor such as explosion which may occur as the process gas is exhausted while having a high temperature.

The description describes the specific configuration and operation of the discharge module 150 with reference to FIGS. 3 to 7.

Figure 3:
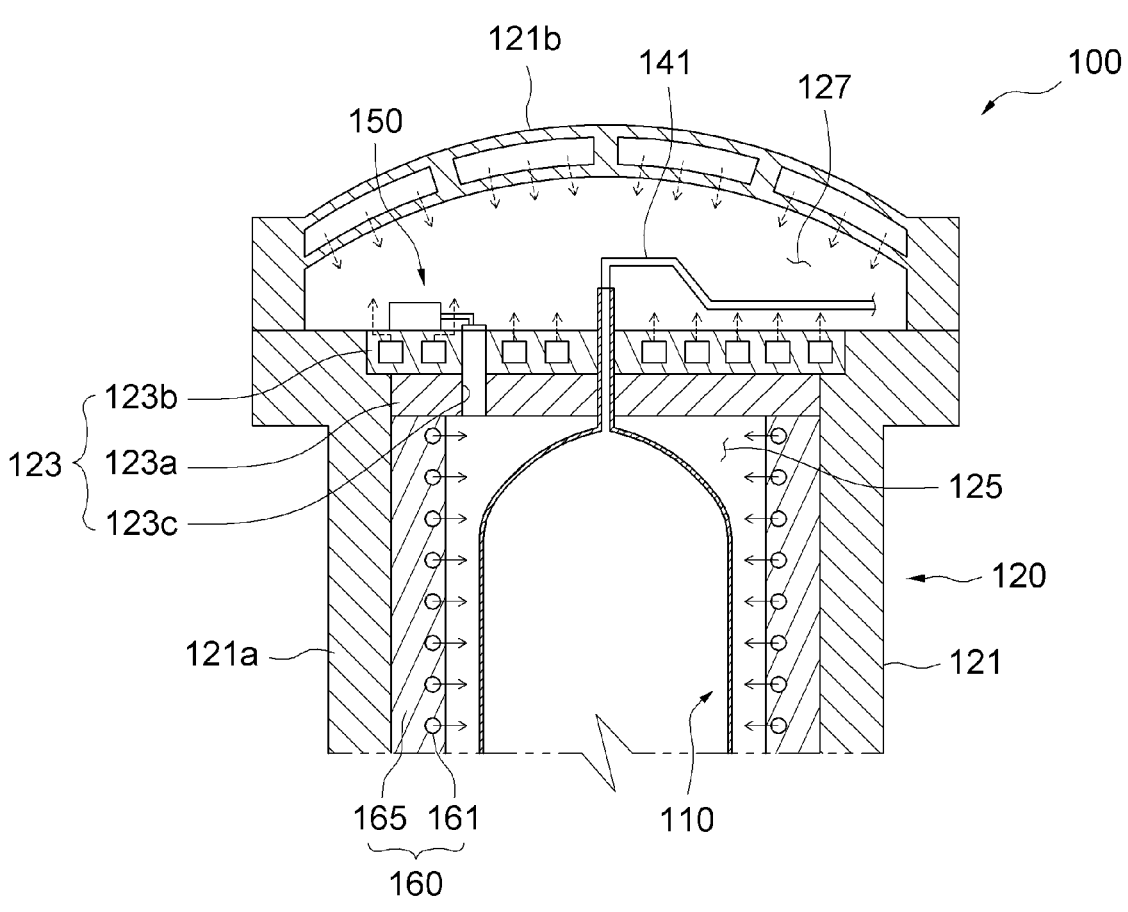
FIG. 3 is a partial cross-sectional view showing one state of components related to a discharge module 150 included in the high pressure heat treatment apparatus 100 of FIG. 1.
Figure 4:
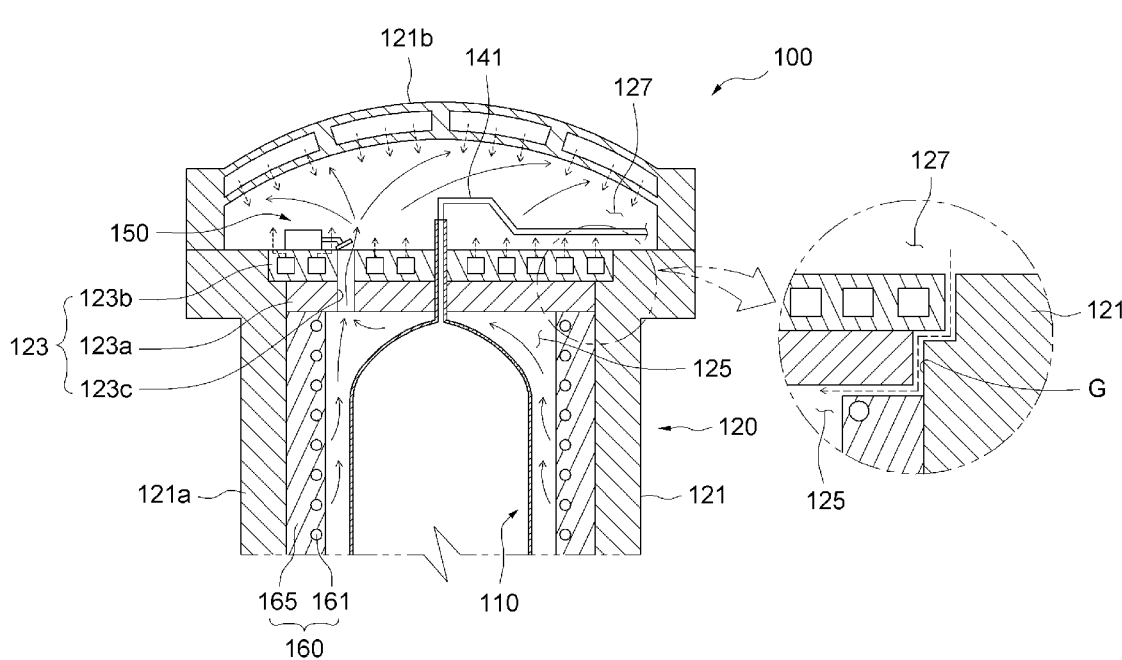
FIG. 4 is a partial cross-sectional view showing another state of the components related to the discharge module 150 of FIG. 3.

FIG. 3 is a partial cross-sectional view showing one state of components related to a discharge module 150 included in the high pressure heat treatment apparatus 100 of FIG. 1; and FIG. 4 is a partial cross-sectional view showing another state of the components related to the discharge module 150 of FIG. 3.

Referring further to these drawings, the housing 121 may include a body part 121a and a cover part 121b. The body part 121a may have a substantially cylindrical shape, and the cover part 121b may have a shape corresponding to an open top of the body part 121a. The cover part 121b may have a substantially dome shape.

The partition plate 123 may be spaced apart from the cover part 121b while facing the cover part 121b. The partition plate 123 may be disposed below the cover part 121b while being supported by the body part 121a. The partition plate 123 may define the high-temperature zone 125 together with the body part 121a and define the low-temperature zone 127 together with the cover part 121b.

The heating module 160 may be disposed in the high-temperature zone 125. The heating module 160 may include a heater 161 and a heat insulation block 165. The heater 161 may surround the internal chamber 110. The heat generated by the heater 161 may heat the protective gas in the high-temperature zone 125 and the process gas in the internal chamber 110. The heat insulation block 165 may embed the heater 161 and block the heat generated by the heater 161 from being transferred to the body part 121a.

A heat insulation layer 123a may occupy a lower portion of the partition plate 123 to correspond to the heater 161. The heat insulation layer 123a may be disposed above the heating module 160 and face the heater 161. The heat insulation layer 123a may block the heat generated by the heater 161 from being transferred to the low-temperature zone 127.

A cooling layer 123b may occupy an upper portion of the partition plate 123. The cooling layer 123b may have a space accommodating the cooling medium, for example, the cooling water. A space accommodating the cooling water may also be positioned in the cover part 121b to correspond to the cooling layer 123b. The cover part 121b may accommodate a greater amount of cooling water than the partition plate 123. The cover part 121b may define an upper portion of the low-temperature zone 127, and the protective gas discharged to the low-temperature zone 127 may thus mainly exchange the heat with the cover part 121b as the gas rises to the maximum.

The cooling water accommodated in the cover part 121b and/or the cooling layer 123b may fill the low-temperature zone 127 with cold air. Accordingly, the low-temperature zone 127 may maintain a low temperature. The protective gas discharged to the low-temperature zone 127 may be cooled by exchanging heat with the cold air.

A discharge hole 123c may pass through the partition plate 123. The discharge hole 123c may allow the high-temperature zone 125 and the low-temperature zone 127 to communicate with each other. The discharge hole 123c may be opened and closed by the discharge module 150.

The external chamber 120 may enable the protective gas to circulate from the low-temperature zone 127 to the high-temperature zone 125. For example, the external chamber 120 may have a gap G between the partition plate 123 and the body part 121a, or between the body part 121a and the heating module 160. In this case, the protective gas may circulate through the gap G.

Through this configuration, the heat generated by the heater 161 may heat the gas in the internal chamber 110 and the high-temperature zone 125 in a state where the discharge module 150 closes the discharge hole 123c (see FIG. 3). The heat generated by the heater 161 may be prevented from being easily transferred to the low-temperature zone 127 due to the heat insulation layer 123a. In addition, the low-temperature zone 127 may maintain the low temperature also by the cooling water of the cover part 121b and/or the cooling layer 123b. Accordingly, the high-temperature zone 125 and the low-temperature zone 127 may have temperatures greatly different from each other even though the two zones have the same pressure as each other.

When the process gas needs to be cooled, the discharge hole 123c may be opened by the operation of the discharge module 150. In this case, the protective gas in the high-temperature zone 125 may rise through the discharge hole 123c and flow into the low-temperature zone 127. The high-temperature protective gas may be cooled by exchanging the heat with the cold air of the cooling water in the low-temperature zone 127. The cooled low-temperature protective gas may return to the high-temperature zone 125 through the gap G (or the discharge hole 123c) between the partition plate 123 and the body part 121a.

As the protective gas circulates by the natural convection, the process gas may be rapidly cooled by exchanging the heat with the protective gas. After sufficiently cooled, the process gas may be exhausted to the outside through the gas exhaust pipe 141.

Next, FIG. 5 is a plan view of the partition plate 123 of FIG. 4.

Referring to this drawing, the discharge hole 123c may be positioned away from the center of the cooling layer 123b. The reason is that an upper portion of the internal chamber 110 is positioned at the center of the cooling layer 123b.

The cooling layer 123b may have a disk shape, and the discharge hole 123c may also be open in a circular shape. In this case, a diameter D1 of the discharge hole 123c may have a specific ratio compared to a diameter D2 of the cooling layer 123b. In detail, the ratio may be determined to a level that thermal shock is prevented from being applied to the internal chamber 110 due to rapid heat discharge while the protective gas is discharged from the high-temperature zone 125 to the low-temperature zone 127.

The description above exemplifies the discharge hole 123c as a passage through which the protective gas flows when being discharged from the high-temperature zone 125 to the low-temperature zone 127. However, the passage may be another type. For example, as the partition plate 123 is configured to rotate or ascend with respect to a horizontal axis, a space between the partition plate 123 and the housing 121 may serve as the passage.

Figure 7:
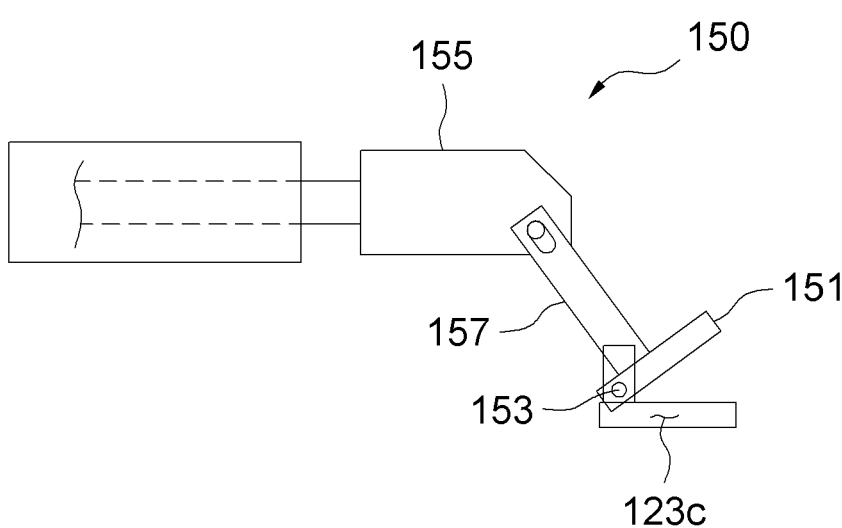
FIG. 7 is a conceptual diagram showing another state of the discharge module 150 of FIG. 3.

FIG. 6 is a conceptual diagram showing one state of the discharge module 150 of FIG. 3; and FIG. 7 is a conceptual diagram showing another state of the discharge module 150 of FIG. 3.

Referring further to these drawings, the discharge module 150 may include a hole cover 151, a hinge 153, an actuator 155, and a link 157.

The hole cover 151 may have a size corresponding to that of the discharge hole 123c. The hole cover 151 may close the discharge hole 123c in a closing position (see FIG. 6). The hole cover 151 may open the discharge hole 123c in an opening position (see FIG. 7).

The hole cover 151 may be rotatably coupled to the partition plate 123 by the hinge 153. This configuration may allow the hole cover 151 to rotate between the closing position and the opening position.

The discharge module 150 may include a driving unit to move the hole cover 151. The driving unit may include the actuator 155 and the link 157.

The actuator 155 may be configured to move forward and backward. The actuator 155 may be, for example, a cylinder operated forward and backward. In more detail, the cylinder may be an electric cylinder operated by an electric motor.

The link 157 may be configured to connect a moving portion of the cylinder to the hole cover 151. One end of the link 157 may be coupled to the hole cover 151. The other end of the link 157 may be rotatably coupled to the moving portion. A long hole may be positioned in any one of the link 157 and the moving portion to correspond to the rotation of the link 157, and a pin movably inserted into the long hole may be installed on the other one.

The high pressure heat treatment apparatus as described above is not limited to the configurations and operation methods of the embodiments described above. The above embodiments may be variously modified by selective combinations of all or some of the respective embodiments.

According to the high pressure heat treatment apparatus according to the present disclosure configured as above, the protective gas supplied to the external chamber which is partitioned into the high-temperature zone accommodating the internal chamber and the low-temperature zone having the lower temperature by the gas supply module may be discharged from the high-temperature zone to the low-temperature zone by the discharge module. Accordingly, the protective gas heated in the high-temperature zone can be rapidly cooled by the heat exchange in the low-temperature zone.

The cooled protective gas may return to the high-temperature zone to thus cool the high-temperature zone and the internal chamber at a rate faster than that of a natural cooling. Accordingly, the high-temperature chamber may be rapidly cooled, thus reducing the tact time in the heat treatment process for the semiconductor wafers.

What is claimed is:

1. A high pressure heat treatment apparatus, the apparatus comprising:

an internal chamber configured to accommodate an object to be heat-treated;

an external chamber including a housing and a partition plate partitioning the housing into a high-temperature zone accommodating the internal chamber and a low-temperature zone configured to have a lower temperature than the high-temperature zone, the partition plate including a discharge hole through which the high-temperature zone and the low-temperature zone communicate with each other, the discharge hole being located in the partition plate at a height above the high-temperature zone;

a gas supply module configured to supply a process gas for the heat treatment to the internal chamber at a first pressure higher than that of the atmosphere, and supply a protective gas to the external chamber at a second pressure set in relation to the first pressure; and a discharge module including a hole cover positioned to correspond to the discharge hole and a driving unit configured to move the hole cover between a closing position for closing the discharge hole and an opening position for opening the discharge hole to discharge the protective gas in the high-temperature zone to the low-temperature zone.

2. The apparatus of claim 1, wherein the housing includes a cover part defining the low-temperature zone together with the partition plate, and at least one of the cover part and the partition plate is configured to accommodate a cooling medium for cooling the protective gas discharged to the low-temperature zone.

3. The apparatus of claim 2, wherein the cover part is disposed above the partition plate while facing the partition plate, and both the cover part and the partition plate accommodate the cooling medium for the low-temperature zone to be filled with cold air made by heat exchange with the cooling medium.

4. The apparatus of claim 3, wherein the cover part is configured to accommodate a greater amount of cooling medium than the partition plate.

5. The apparatus of claim 1, wherein the external chamber is configured to enable the protective gas to circulate to the high-temperature zone after being cooled in the low-temperature zone by exchanging heat with a cooling medium.

6. The apparatus of claim 1, wherein the discharge module further includes a hinge for rotatably coupling the hole cover to the partition plate.

7. The apparatus of claim 6, wherein the driving unit includes an actuator configured to move forward and backward, and a link coupled to the hole cover and rotatably coupled to the actuator.

8. The apparatus of claim 1, further comprising a gas exhaust module configured to exhaust the process gas and the protective gas from the internal chamber and the external chamber, wherein the discharge module is operated to open the discharge hole before the gas exhaust module is operated.

9. The apparatus of claim 1, further comprising a heating module disposed in the high-temperature zone, and configured to heat the process gas and the protective gas in the high-temperature zone, wherein the partition plate further includes a heat insulation layer disposed to face the heating module.

* * * * *